(12) United States Patent
Matsui

(10) Patent No.: US 8,119,928 B2
(45) Date of Patent: Feb. 21, 2012

(54) MULTI-LAYERED WIRING SUBSTRATE AND METHOD OF MANUFACTURING THE SAME

(75) Inventor: Isao Matsui, Tokyo (JP)

(73) Assignee: NEC Corporation, Tokyo (JP)

( * ) Notice: Subject to any disclaimer, the term of this patent is extended or adjusted under 35 U.S.C. 154(b) by 556 days.

(21) Appl. No.: 12/343,844

(22) Filed: Dec. 24, 2008

(65) Prior Publication Data
US 2009/0166078 A1 Jul. 2, 2009

(30) Foreign Application Priority Data

Dec. 28, 2007 (JP) .................. 2007-338859

(51) Int. Cl.
H05K 1/16 (2006.01)
H05K 1/00 (2006.01)
H05K 1/03 (2006.01)

(52) U.S. Cl. ........ 174/261; 174/250; 174/255; 361/772; 361/803

(58) Field of Classification Search .................. None
See application file for complete search history.

(56) References Cited

U.S. PATENT DOCUMENTS

| | | | | |
|---|---|---|---|---|
| 5,326,936 A * | 7/1994 | Taniuchi et al. | ............. | 174/260 |
| 5,386,087 A * | 1/1995 | Lee et al. | ............. | 174/261 |
| 5,644,839 A * | 7/1997 | Stone | ............. | 29/842 |
| 6,135,781 A * | 10/2000 | Pope et al. | ............. | 439/59 |
| 6,399,889 B1 * | 6/2002 | Korkowski et al. | ......... | 174/255 |
| 6,691,408 B2 * | 2/2004 | Biron | ............. | 29/852 |
| 7,348,497 B2 * | 3/2008 | Kawauchi et al. | .......... | 174/260 |
| 7,525,816 B2 * | 4/2009 | Sawachi | ............. | 361/792 |
| 7,669,321 B1 * | 3/2010 | Levy et al. | ............. | 29/852 |
| 7,808,104 B2 * | 10/2010 | Koyama | ............. | 257/730 |
| 2004/0050586 A1 * | 3/2004 | Roh | ............. | 174/260 |

FOREIGN PATENT DOCUMENTS

| | | |
|---|---|---|
| JP | 08-307051 | 11/1996 |
| JP | 11-177235 | 7/1999 |
| JP | 11-266077 | 9/1999 |

* cited by examiner

*Primary Examiner* — Boris Chervinsky
(74) *Attorney, Agent, or Firm* — Young & Thompson

(57) ABSTRACT

In a multi-layered wiring substrate according to an exemplary aspect of the present invention, a conductor formed in an edge face area functions as a pad for mounting a connector.

11 Claims, 4 Drawing Sheets

MULTI-LAYERED WIRING SUBSTRATE AND METHOD OF MANUFACTURING THE SAME

INCORPORATION BY REFERENCE

This application is based upon and claims the benefit of priority from Japanese patent application No. 2007-338859, filed on Dec. 28, 2007, the disclosure of which is incorporated herein in its entirety by reference.

BACKGROUND OF THE INVENTION

1. Technical Field

The present invention relates to a multi-layered wiring substrate and a method of manufacturing the same.

2. Background Art

A multi-layered wiring substrate includes a pad for mounting a connector in a front surface and a rear surface (hereinafter referred to as related art 1). Accordingly, when the connector is connected to a signal pattern in an inner layer of the multi-layered wiring substrate, this connection is performed as shown in FIG. 6. First, a through hole a is formed. Then, a conductor provided in an inner wall face of the through hole a is connected to a pad b on a front surface. Then, a connector 7 is connected to the pad b.

Japanese Unexamined Patent Application Publication Nos. 8-307051, 11-177235, and 11-266077 each discloses a multi-layered wiring substrate. In the multi-layered wiring substrate disclosed in Japanese Unexamined Patent Application Publication Nos. 8-307051, 11-177235, and 11-266077, a through hole is formed on a cutting plane line of the multi-layered wiring substrate. Further, the multi-layered wiring substrate is formed by forming a conductor in an inner wall face of the through hole and cutting the multi-layered wiring substrate along with a cutting plane line thereof.

When the multi-layered wiring substrate of the related art 1 is employed, the size of the substrate needs to be increased when not all the elements can be mounted on the substrate. Alternatively, a plurality of substrates need to be prepared in the multi-layered wiring substrate of the related art 1. Accordingly, it is difficult to mount the elements in high density.

In the multi-layered wiring substrate disclosed in Japanese Unexamined Patent Application Publication Nos. 8-307051, 11-177235, and 11-266077, a halved through hole is formed in an edge face of the multi-layered wiring substrate. Then the conductor is formed in the inner wall face of the through hole. However, the conductor formed in the inner wall face does not function as a pad.

SUMMARY

An exemplary object of the present invention is to provide a multi-layered wiring substrate which makes it possible to mount elements in high density by forming a pad in an edge face, and a method of manufacturing the same.

An exemplary aspect of the invention is a multi-layered wiring substrate, including a through hole formed on a cutting plane line of the multi-layered wiring substrate and cut off along with the cutting plane line to expose an inner wall face of the through hole in an edge face area of the multi-layered wiring substrate, and a conductor formed in the inner wall face of the through hole and functioning as a pad for mounting a connector.

The above and other objects, features and advantages of the present invention will become more fully understood, from the detailed description given hereinbelow and the accompanying drawings which are given by way of illustration only, and thus are not to be considered as limiting the present invention.

EXEMPLARY EMBODIMENT

The specific exemplary embodiment to which the present invention is applied will be described in detail with reference to the drawings. Some parts of the description below and the drawings are simplified as appropriate for the sake of clarity.

First Exemplary Embodiment

The first exemplary embodiment of a multi-layered wiring substrate and a method of manufacturing the same according to the present invention will be described with reference to FIGS. 1 to 3.

First, a method of manufacturing a multi-layered wiring substrate 1 will be described for the convenience of the description.

Figure 1A:
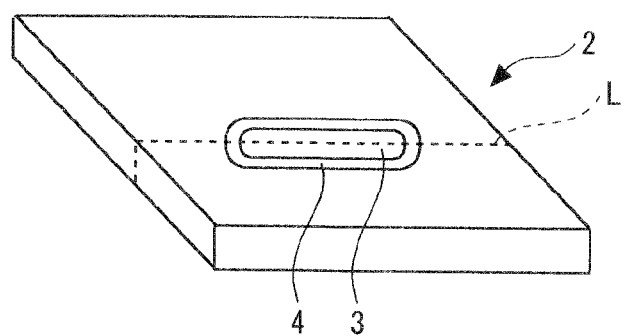
FIGS. 1A to 1C are process diagrams showing a method of manufacturing a multi-layered wiring substrate according to a first exemplary embodiment of the present invention.

As shown in FIG. 1A, a cutting plane line L is set in a base material 2 in advance. The cutting plane line L is the line for cutting off the multi-layered wiring substrate 1. Then, a through hole 3 is formed on the cutting plane line L. The through hole 3 has an elliptical shape as an example; however, the through hole 3 may have a circular shape or an angular shape. Next, plating is carried out on the base material 2. As a result, a conductor 4 is formed in an inner wall face of the through hole 3. At this time, the conductor 4 is formed to be connected to a signal pattern of an inner layer of the base material 2. However, a method of forming the conductor 4 is not limited to this example.

Figure 1B:
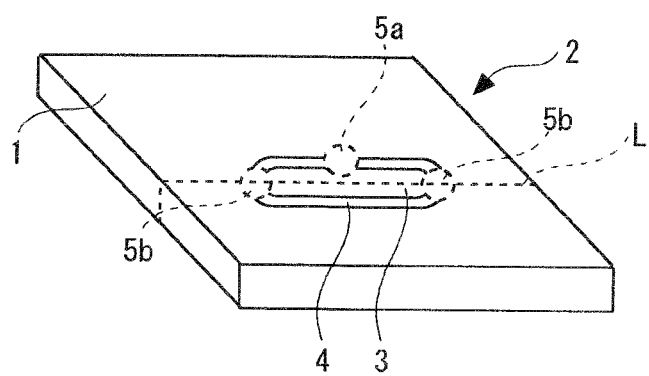
Figure 1C:
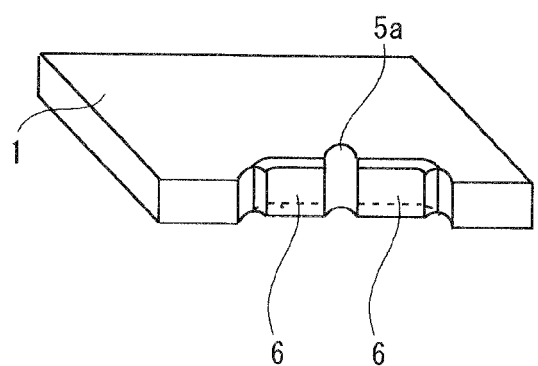

Then, as shown in FIG. 1B, a cutout 5a is provided in the conductor 4 of the through hole 3. The cutout 5a is provided in the conductor 4 in an edge face area of the multi-layered wiring substrate 1 that will be cut off in the later process. The cutout 5a is provided in a whole area of a thickness direction of the base material 2. As a result, the conductor 4 is divided. In this stage, it is preferable that cutouts 5b are also provided in the conductor 4 near the cutting plane line L of the multi-layered wiring substrate 1. By providing the cutouts 5b, it is possible to prevent the conductor 4 from peeled off when the multi-layered wiring substrate 1 is cut off along with the cutting plane line L in the later process. The cutouts 5a and 5b are formed by an etching process or a drilling process such as a router.

Then, the base material 2 is cut off along with the cutting plane line L of the multi-layered wiring substrate 1. As a result, the multi-layered wiring substrate 1 shown in FIG. 1C can be formed. In the multi-layered wiring substrate 1, it is possible to employ the conductor 4 formed in the edge face area as a pad 6 for mounting a connector.

Figure 2:
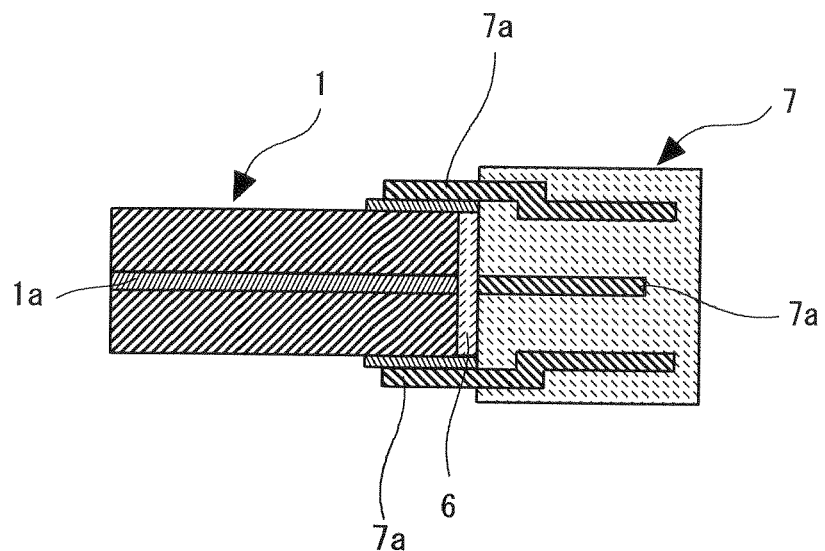
FIG. 2 is a cross-sectional view schematically showing a state where a connector is mounted to a pad of an edge face of the multi-layered wiring substrate.
Figure 3:
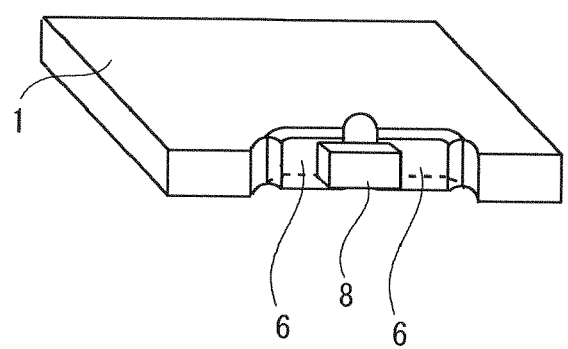
FIG. 3 is a perspective view schematically showing a state where a capacitor is mounted to the pad of the edge face of the multi-layered wiring substrate.

Accordingly, as shown in FIG. 2, a signal pin 7a of the connector 7 can be directly connected to the pad 6 formed in the edge face of the multi-layered wiring substrate 1. Accordingly, it is possible to mount elements to the edge face of the multi-layered wiring substrate 1 through the connector 7. Therefore, the elements can be mounted in high density in the multi-layered wiring substrate 1. Further, it is possible to connect the connector 7 to the signal pattern of the inner layer 1a of the multi-layered wiring substrate 1 without connecting via the through hole. Accordingly, the signal loss can be decreased and the high-speed signal processing can be realized in the multi-layered wiring substrate 1.

Further, any special process or system is not required for forming the pad 6. As such, it is possible to easily form the pad 6 in the edge face of the multi-layered wiring substrate 1.

In the first exemplary embodiment, the cutout 5a is provided in the conductor 4 to divide the pad 6. Accordingly, a capacitor 8 can be mounted to the pad 6 as shown in FIG. 3. The capacitor 8 is provided to cross the pads 6 adjacent to each other.

Second Exemplary Embodiment

The second exemplary embodiment of the multi-layered wiring substrate and the method of manufacturing the same according to the present invention will be described with reference to FIG. 4. The second exemplary embodiment is preferably implemented when the thickness of the multi-layered wiring substrate is large.

Figure 4A:
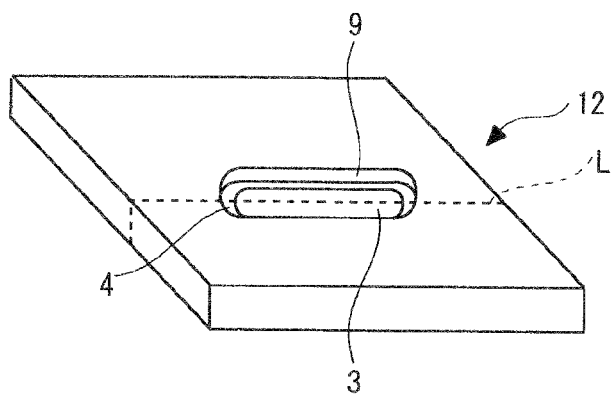
FIGS. 4A to 4C are process diagrams showing a method of manufacturing a multi-layered wiring substrate according to a second exemplary embodiment of the present invention.

The manufacturing method is substantially the same as that of the first exemplary embodiment. The through hole 3 is formed in the base material 12, and the conductor 4 is formed in the inner wall face of the through hole 3. Then, as shown in FIG. 4A, a counter-bored portion 9 is formed along with the periphery of the through hole 3. The counter-bored portion 9 is formed by drilling the conductor 4 from both of the front surface and the rear surface of the base material 12. At this time, the conductor 4 is drilled into the thickness suitable for connecting the connector 7 as the counter-bored portion 9. In the second exemplary embodiment, the conductor 4 is drilled from both of the front surface and the rear surface. However, the conductor 4 may be drilled only from one of the front surface and the rear surface as long as the conductor 4 is connected to the signal pattern of the inner layer of the multi-layered wiring substrate 11.

Figure 4B:
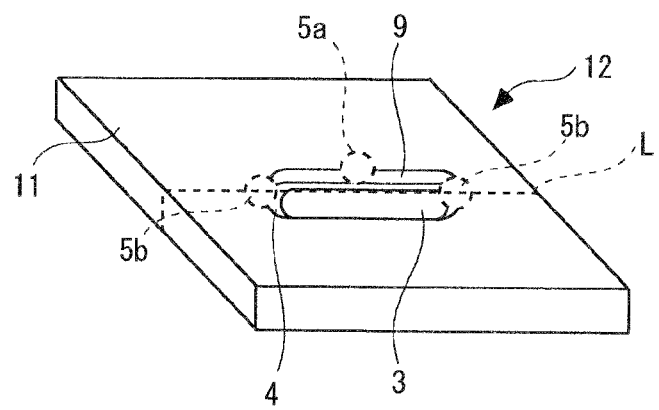
Figure 4C:
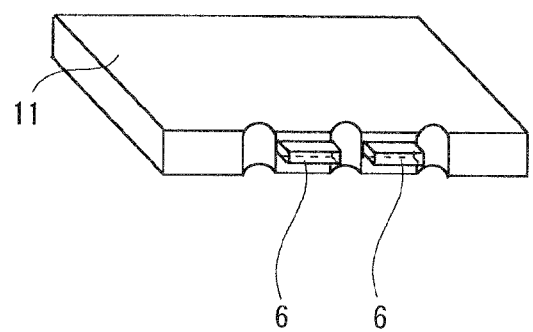

Then, as shown in FIG. 4B, the cutouts 5a and 5b are provided in the conductor 4 of the through hole 3. The base material 12 is cut along with the cutting plane line L of the multi-layered wiring substrate 11. As a result, the multi-layered wiring substrate 11 shown in FIG. 4C can be formed. The multi-layered wiring substrate 11 is able to use the conductor 4 formed in the edge face area as the pad 6 for mounting the connector. By configuring the multi-layered wiring substrate 11 as above, higher-speed signal processing can be realized.

Figure 5:
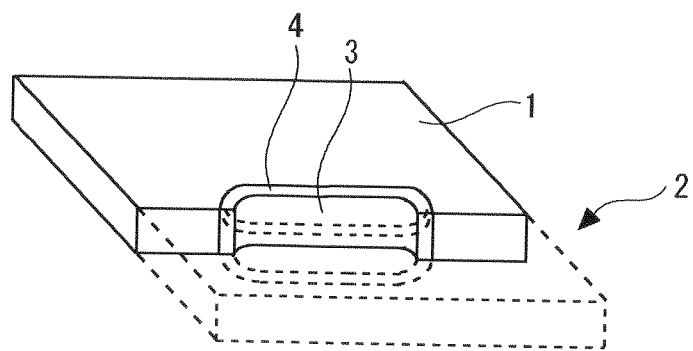
FIG. 5 is a perspective view showing a multi-layered wiring substrate according to another exemplary embodiment of the present invention.
Figure 6:
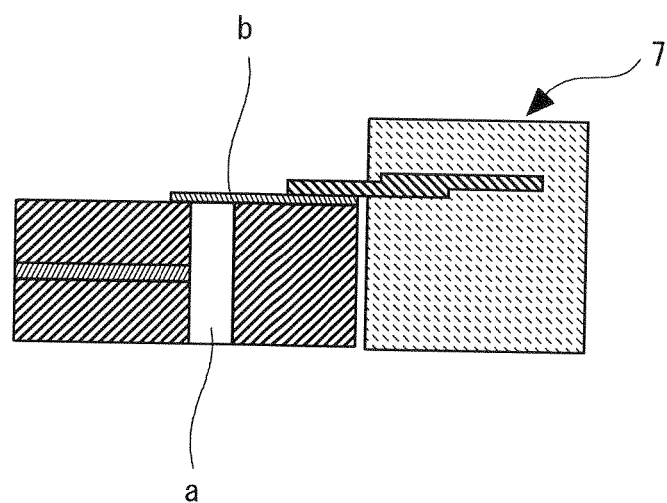
FIG. 6 is a cross-sectional view schematically showing a state where a connector is mounted to a pad of a related multi-layered wiring substrate.

In the first and second exemplary embodiments, the cutouts 5a and 5b are provided in the conductor 4 of the through hole 3. However, even when there are no cutouts 5a and 5b, the object of the present invention can be achieved as well, as shown in FIG. 5. In summary, the multi-layered wiring substrate 1 (11) may have any structure as long as the conductor 4 formed in the edge face area of the multi-layered wiring substrate 1 (11) can be used as the pad 6 for mounting the connector.

In the first and second exemplary embodiments, the cutout 5a is provided in one area. However, the cutout 5a may be provided in a plurality of areas.

A method of manufacturing a multi-layered wiring substrate according to exemplary embodiments of the present invention includes forming a throughhole on a cutting plane line of the multi-layered wiring substrate of a base material, forming a conductor in an inner wall face of the through hole, and cutting the base material along with the cutting plane line of the multi-layered wiring substrate and employing the conductor formed in an edge face area of the multi-layered wiring substrate as a pad for mounting a connector.

According to the multi-layered wiring substrate of the above-described related art 1, when the connector is connected to the signal pattern of the inner layer through the through hole, the high-speed signal processing becomes difficult due to the reflection or the loss of the waveform.

An exemplary object of the present invention is to provide a multi-layered wiring substrate which can realize the high-speed signal processing by forming the pad in the edge face, and a met-hod of manufacturing the same.

According to the present invention, the pad is formed in the edge face, which makes it possible to realize the high-speed signal processing.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A multi-layered wiring substrate, comprising:
   a through hole formed on a cutting plane line of the multi-layered wiring substrate and cut off along with the cutting plane line to expose an inner wall face of the through hole in an edge face area of an edge face of the multi-layered wiring substrate formed by cutting the multi-layered wiring substrate along the cutting plane line from a first edge face of the multi-layered wiring substrate to a second edge face of the multi-layered wiring substrate opposed to the first edge face; and
   a conductor formed in the inner wall face of the through hole and functioning as a pad for mounting a connector.

2. The multi-layered wiring substrate according to claim 1, wherein the pad is divided into a plurality of parts.

3. The multi-layered wiring substrate according to claim 1, wherein a counter-bored portion is formed along with a periphery of the through hole.

4. The multi-layered wiring substrate according to claim 2, wherein a counter-bored portion is formed along with a periphery of the through hole.

5. The multi-layered wiring substrate according to claim 1, wherein the conductor includes first and second spaced apart pads divided therefrom in the inner wall face of the through hole.

6. The multi-layered wiring substrate according to claim 1, wherein a base material of the multi-layered wiring substrate has a front surface and a rear surface opposed thereto and an inner layer having a signal pattern disposed internally within the base material and parallel to the front and rear surfaces, wherein the conductor is formed connected to the inner layer.

7. An assembly including the multi-layered wiring substrate according to claim 6, and a capacitor mounted across the pads.

8. A method of manufacturing a multi-layered wiring substrate, the method comprising:
   forming a through hole on a cutting plane line of the multi-layered wiring substrate of a base material;
   forming a conductor in an inner wall face of the through hole;
   forming cutouts in the conductor near the cutting plane line of the multi-layered wiring substrate, thereby to form at least two separate conductors from said conductor; and
   cutting the base material along the cutting plane line of the multi-layered wiring substrate and employing the conductor separate conductors formed in an edge face area of the multi-layered wiring substrate as pads for mounting conductors.

9. The method of manufacturing the multi-layered wiring substrate according to claim 8, wherein a counter-bored portion is formed along with a periphery of the through hole after forming the conductor in the inner wall face of the through hole.

10. The method of manufacturing the multi-layered wiring substrate according to claim 8, wherein a base material of the multi-layered wiring substrate has a front surface and a rear surface opposed thereto and an inner layer having a signal pattern disposed internally within the base material and parallel to the front and rear surfaces, wherein the step of forming the conductor forms the conductor to contact the inner layer.

11. A method of manufacturing an assembly including manufacturing the multi-layered wiring substrate according to claim 8, further comprising mounting a capacitor across the pads.

* * * * *